United States Patent
Salling

(10) Patent No.: US 6,574,131 B1
(45) Date of Patent: Jun. 3, 2003

(54) DEPLETION MODE FERROELECTRIC MEMORY DEVICE AND METHOD OF WRITING TO AND READING FROM THE SAME

(75) Inventor: Craig T. Salling, Plano, TX (US)

(73) Assignee: Micron Technology, Inc., Boise, ID (US)

(*) Notice: Subject to any disclaimer, the term of this patent is extended or adjusted under 35 U.S.C. 154(b) by 315 days.

(21) Appl. No.: 09/652,877

(22) Filed: Aug. 31, 2000

(51) Int. Cl.$^7$ .......................... G11C 11/22; H01L 29/43
(52) U.S. Cl. ...................... 365/145; 365/149; 257/295
(58) Field of Search .................. 365/145, 149; 257/295

(56) References Cited

U.S. PATENT DOCUMENTS

| | | | |
|---|---|---|---|
| 4,888,630 A | 12/1989 | Paterson | 365/185.24 |
| 5,119,329 A | 6/1992 | Evans, Jr. et al. | 365/145 |
| 5,146,299 A | 9/1992 | Lampe et al. | 257/295 |
| 5,273,927 A | 12/1993 | Gnadinger | 438/3 |
| 5,289,410 A | 2/1994 | Katti et al. | 365/170 |
| 5,345,414 A | 9/1994 | Nakamura | 365/145 |
| 5,633,821 A | 5/1997 | Nishimura et al. | 365/145 |
| 5,680,344 A | 10/1997 | Seyyedy | 365/145 |
| 5,780,886 A * | 7/1998 | Yamanobe | 257/295 |
| 5,812,442 A | 9/1998 | Yoo | 365/145 |
| 5,847,989 A | 12/1998 | Seyyedy | 365/145 |
| 5,905,672 A | 5/1999 | Seyyedy | 365/145 |
| 5,907,861 A | 5/1999 | Seyyedy | 711/152 |
| 5,909,389 A | 6/1999 | Kawakubo et al. | 365/145 |
| 5,932,903 A * | 8/1999 | Miyamoto | 257/295 |
| 5,973,911 A | 10/1999 | Nishioka | 361/313 |
| 5,989,927 A * | 11/1999 | Yamanobe | 438/3 |
| 5,990,507 A | 11/1999 | Mochizuki et al. | 257/295 |
| 5,999,439 A | 12/1999 | Seyyedy | 365/145 |
| 6,028,784 A | 2/2000 | Mori et al. | 365/145 |
| 6,046,927 A * | 4/2000 | Lee et al. | 365/145 |
| 6,049,477 A | 4/2000 | Taira | 365/145 |
| 6,067,244 A | 5/2000 | Ma et al. | 365/145 |
| 6,121,642 A | 9/2000 | Newns | 257/192 |
| 6,144,579 A | 11/2000 | Taira | 365/145 |

\* cited by examiner

*Primary Examiner*—Andrew Q. Tran
(74) *Attorney, Agent, or Firm*—Leffert Jay & Polglaze, P.A.

(57) ABSTRACT

Depletion-mode ferroelectric transistors are adapted for use as non-volatile memory cells. Such memory cells find use in non-volatile memory devices as well as other electronic systems having non-volatile memory storage. Various embodiments are described having ferroelectric transistors formed on a semiconductor layer overlying a bit line. By forming the transistors on this elevated semiconductor layer, the underlying substrate is usable for other components of a memory device, such as sensing devices and decoder circuits, thus facilitating higher-density devices. Because the transistors display bulk transport characteristics, they can be fabricated on polysilicon as the semiconductor layer despite relatively poor Si—SiO$_2$ interfaces.

37 Claims, 8 Drawing Sheets

DEPLETION MODE FERROELECTRIC MEMORY DEVICE AND METHOD OF WRITING TO AND READING FROM THE SAME

TECHNICAL FIELD OF THE INVENTION

The present invention relates to ferroelectric memory devices and particularly to memory cells and memory array architectures making use of ferroelectric depletion-mode field-effect transistors.

BACKGROUND OF THE INVENTION

Ferroelectric materials are a class of materials that can be thought of as having electrical properties somewhat analogous to the magnetic properties of ferromagnetic materials. A uniaxial ferromagnetic material can be magnetized in one of two directions, and thereafter will retain a magnetic field in that direction even after the applied magnetic field is removed; similarly, a ferroelectric material can be "polarized" in either direction (by applying an electric field to it), and thereafter will retain an electric field in that direction, even after the applied electric field is removed.

Ferroelectric materials have been successfully integrated into integrated circuit processes, but this integration can have some drawbacks. Ferroelectric materials having sufficient thermal stability for integrated circuit processing often include incompatible metals that must be separated from a silicon substrate. Such ferroelectric materials also tend to be strong oxygen sources, increasing the risk of undesirable oxidation of adjacent materials. Additionally, ferroelectric materials generally can only withstand a finite number of polarization reversals before their performance degrades.

Ferroelectric memories exploit the properties of ferroelectric materials. These materials are useful in semiconductor memories as they have characteristics to provide a non-volatile memory function; after a ferroelectric material has been polarized in one direction, it will hold that polarization for an extended time without further power input. In contrast, dynamic random access memory (DRAM) requires periodic refresh to maintain its data value, thus losing its data value upon the removal of its power source.

Since the physics of ferroelectric floating-gate memories are similar to standard floating-gate memories (such as Flash memories), the sensing operation is correspondingly similar. Typically, floating-gate memories are sensed by detecting the activation/deactivation of the selected transistor in response to a given gate/source voltage. Although a typical floating-gate memory's activation/deactivation state is dependent on a stored charge of its floating gate, and a ferroelectric floating-gate memory's activation/deactivation state is dependent on a polarization of a ferroelectric layer, they both can exhibit this binary behavior.

At the microscopic scale, the ferroelectric material can be seen to be divided into domains. A domain is a volume within which the polarization of the material is uniform. Each domain can have only two stable polarization states. The magnitude of the polarization state of the bulk material is a composite of the individual domain polarization states.

FIG. 1 schematically shows a typical hysteresis curve 102 for a ferroelectric material. When the applied electric field E is increased to a positive value $E_1$, the polarization of the material will increase to a value $P_1$. When the applied positive field is subsequently removed, the polarization will fall back to a positive "remanent polarization" value $P_r$. In a similar manner, when the applied electric field is increased in the opposite direction, to a negative value $-E_2$, the polarization of the material will go to a negative value $-P_2$. When the applied negative field is subsequently removed, the polarization will fall back to a negative remanent polarization value $-P_r$. Thus, the material can take either of two polarization states in the absence of an electric field, depending on how it has been affected by the previously applied field. For electrical circuit analysis, the polarization state of a ferroelectric film can be thought of in terms of surface charge density, i.e., as amount of charge per unit area (usually written as "σ"). Curve 104 is an example of a minor hysteresis curve obtained when the same material is cycled between electrical potentials having insufficient magnitude to cause complete reversal of the polarization.

When an increasingly strong electric field is applied to a ferroelectric material, more and more of the domains will change their state to line up with the applied field. The electric field seen by any one domain is affected by the polarization states of the other domains which are nearby. Consequently, a full reversal of polarization requires not only some threshold energy level, but also some delay as individual domains align. This is inconvenient for ferroelectric memories, since it limits the write speed of any such memory. Moreover, in memories that use a destructive read, i.e., a read operation using a voltage sufficient to cause reversal of polarity, this phenomenon is also an important constraint on read access time as the data must be rewritten after sensing. This has been a problem with commercialization of ferroelectric memories, since it is highly desirable for ferroelectric memories to have access times approximately as fast as those for DRAM memories.

Designers are under constant pressure to provide higher-density, and thus smaller, semiconductor devices. Semiconductor real estate equates to cost, and more efficient use of that real estate generally leads to lower-cost devices.

For the reasons stated above, and for other reasons stated below that will become apparent to those skilled in the art upon reading and understanding the present specification, there is a need in the art for alternate architecture and methods of operation of ferroelectric semiconductor memory devices.

SUMMARY OF THE INVENTION

The above-mentioned problems with memory devices and other problems are addressed by the present invention and will be understood by reading and studying the following specification.

Depletion-mode ferroelectric transistors are described herein for use as non-volatile memory cells. Such memory cells find use in non-volatile memory devices as well as other electronic systems having non-volatile memory storage. Various embodiments are described having ferroelectric transistors formed on a semiconductor layer overlying a bit line. By forming the transistors on this elevated semiconductor layer, the underlying substrate is usable for other components of a memory device, such as sensing devices and decoder circuits, thus facilitating higher-density devices. Because the transistors display bulk transport characteristics, they can be fabricated on polysilicon as the semiconductor layer despite relatively poor Si—SiO₂ interfaces.

For one embodiment, the invention provides a ferroelectric memory cell. The memory cell includes a ferroelectric layer formed overlying a conductively-doped semiconductor layer, wherein the semiconductor layer is formed overlying a bit line. The memory cell further includes a control gate formed overlying the ferroelectric layer and coupled to a word line. The memory cell still further includes a first source/drain region formed in the semiconductor layer and a second source/drain region formed in the semiconductor layer. The first source/drain region is coupled to a program line. The second source/drain region is coupled to the bit line. For a further embodiment, the semiconductor layer is a silicon-containing layer and the first and second source/drain regions each contain a metal silicide. For a still further embodiment, the first and second source/drain regions are doped regions of the semiconductor layer having the same conductivity type, but a higher dopant level.

For another embodiment, the invention provides a memory cell. The memory cell includes a gate dielectric layer formed on a conductively-doped polysilicon layer, wherein the conductively-doped polysilicon layer is formed overlying a bulk insulator layer. The memory cell further includes a floating gate formed on the gate dielectric layer, a ferroelectric layer formed on the floating gate, and a control gate formed on the ferroelectric layer and coupled to a word line. The memory cell still further includes a metal silicide trace formed in the polysilicon layer as a first source/drain region and a metal silicide island formed in the polysilicon layer as a second source/drain region.

For a further embodiment, the invention provides a ferroelectric memory array. The memory array includes a plurality of program lines formed in a conductively-doped semiconductor layer, a plurality of bit lines formed below the semiconductor layer, a plurality of ferroelectric transistors formed on the conductively-doped semiconductor layer, and a plurality of word lines formed on the plurality of ferroelectric transistors. Each ferroelectric transistors has a first source/drain region coupled to a program line, a second source/drain region coupled to a bit line, and a control gate coupled to a word line.

The invention further provides apparatus, systems and methods of various scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Memory cells in accordance with various embodiments of the invention include a ferroelectric (FE) field-effect transistor (FET), such as a metal-ferroelectric-metal-oxide-semiconductor (MFMOS) FET. Each FE FET of the various embodiments is a depletion mode, or normally activated, device. The FE FETs include an FE dielectric material.

The fabrication of the structures of the various example embodiments are demonstrated using silicon MOS technology. Memory cells of the example embodiments are fabricated on a polysilicon layer having a conductivity type, such as an n-type conductivity, overlying a monocrystalline silicon substrate. However, as noted above, other substrates may be used for integrated circuit fabrication. Furthermore, the various embodiments could similarly be fabricated having opposite conductivity, using appropriate changes in dopants and applied voltages. Additionally, various components of the memory cells may be fabricated in an order different from the example embodiments while still producing a memory cell in accordance with the invention.

FIGS. 2A–2E show a cross-section of memory cells at various stages of fabrication in accordance with an embodiment of the invention. The memory cells may form a portion of a memory array.

Figure 1:
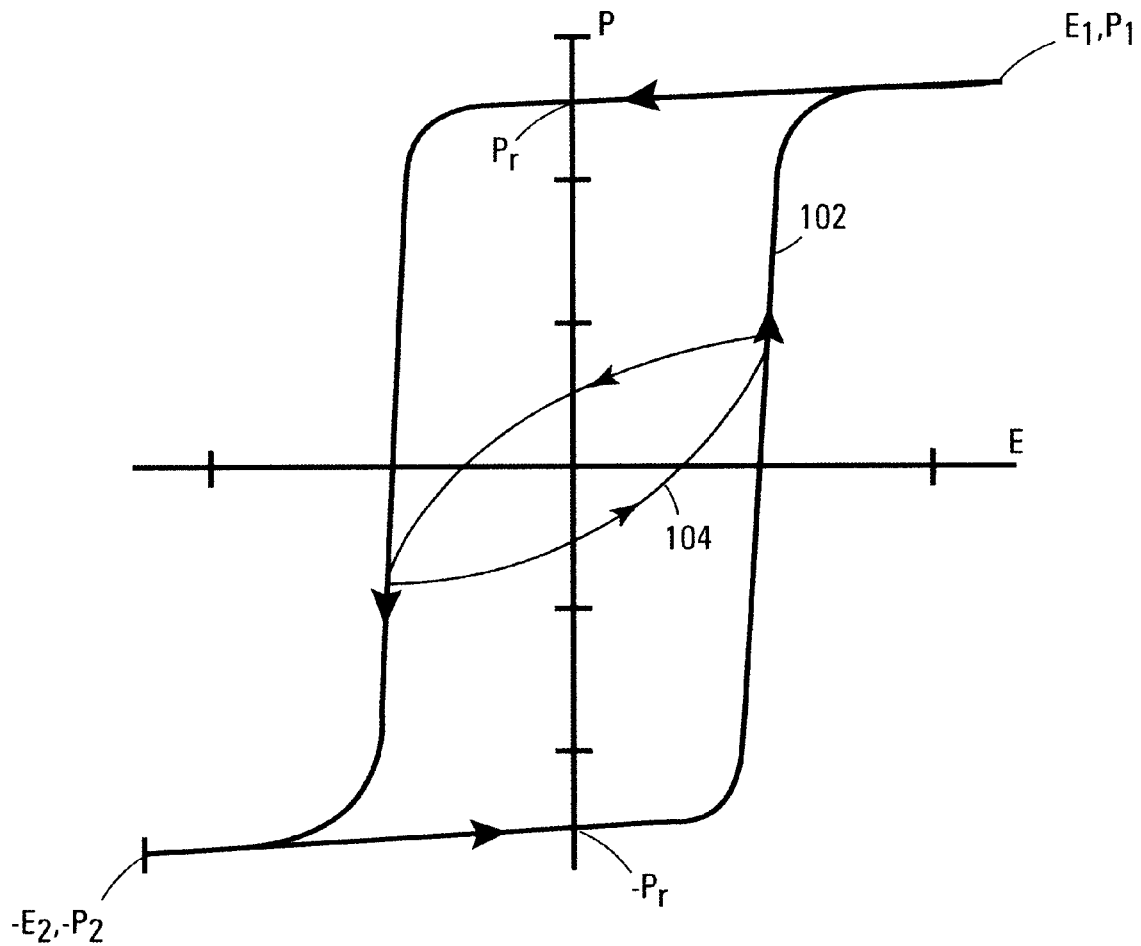
FIG. 1 is a diagram of typical hysteresis curves for a ferroelectric material.
Figure 2A:
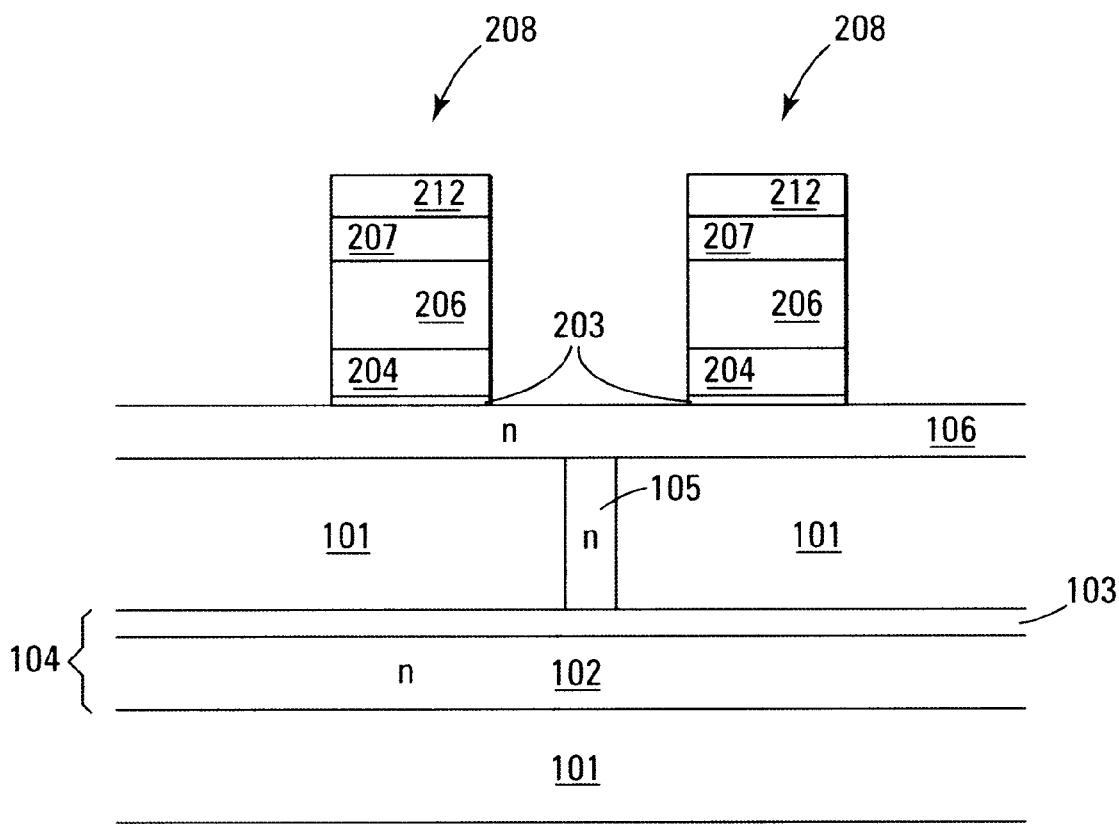
FIG. 2A–2E are cross-sectional views of memory cells at various stages in their fabrication n accordance with one embodiment of the invention.

As shown in FIG. 2A, gate stacks 208 have been formed overlying a conductively-doped semiconductor layer, such as a polysilicon layer 106 or other silicon-containing layer. Although generally more costly to produce, the gate stacks 208 could be formed overlying a conductively-doped monocrystalline silicon layer, such as an epitaxial layer. Several fabrication stages have been performed to obtain the structure depicted in FIG. 2A. A bit line 104 is formed in a bulk insulator layer 101. As an example, a first portion of the bulk insulator layer 101 may be formed overlying a substrate (not shown), the bit line 104 is then formed overlying this first portion of the bulk insulator layer 101 and a second portion of the bulk insulator layer 101 is formed overlying and surrounding the bit line 104. This construction allows the bit line 104 and gate stacks 208 to be formed over the same area of substrate used for fabrication of the decoder circuits and sensing devices.

Bulk insulator layer 101 contains an insulating or dielectric material. Examples include silicon oxides, silicon nitrides and silicon oxynitrides. Furthermore, the dielectric materials may include doped silicon oxides, such as borophosphosilicate glass (BPSG). The bit line 104 is coupled to columns of memory cells of a memory array. Each bit line 104 contains a conductive material. For one embodiment, the bit line 104 contains a metal or metal silicide. For another embodiment, the bit line 104 contains a metal alloy. For a further embodiment, the bit line 104 contains more than one layer of conductive material. For the example embodiment, bit line 104 contains a conductively-doped polysilicon layer 102 and a metal silicide layer 103, such as a tungsten silicide or other refractory metal silicide. The conductively-doped polysilicon generally may be formed through ion implantation or dopant diffusion into a polysilicon layer deposited through chemical-vapor deposition (CVD) techniques.

The bulk insulator layer 101 is patterned to expose a portion of the bit line 104 as a bit line contact. A conductive plug 105 is formed to couple to the bit line 104. A conductively-doped semiconductor layer, such as a second conductively-doped polysilicon layer 106, is then formed overlying the bulk insulator layer 101 and coupled to the bit line 104 through the conductive plug 105. Again, the conductively-doped polysilicon generally may be formed through ion implantation or dopant diffusion into a polysilicon layer deposited through CVD techniques. Both polysilicon layers 102 and 106, as well as the conductive plug 105, have the same conductivity type, such as an n-type conductivity.

The following describes formation of the gate stacks 208. The gate dielectric layer 203 is formed overlying the polysilicon layer 106. The gate dielectric layer 203 is a non-ferroelectric dielectric material, such as a silicon oxide. The silicon oxide may be formed by conventional methods, such as thermal oxidation. As an example, the substrate may be placed in an oxygen-containing ambient at approximately 900° C. to grow the gate dielectric layer 203. Other methods of forming the gate dielectric layer 203 include physical vapor deposition (PVD) and chemical vapor deposition (CVD) as is known in the art of integrated circuit fabrication. For another embodiment, the gate dielectric layer 203 is silicon nitride formed by a PVD process, such as jet vapor deposition. Other dielectric materials may be used for the gate dielectric layer 203. Specific examples include silicon oxides, silicon nitrides and silicon oxynitrides.

The floating gate 204 contains a conductive material, such as conductively-doped polysilicon, metal silicide, metal or metal alloy. Polysilicon layers are generally formed by CVD. Metal silicide layers may be formed directly through CVD, or they may be formed sequentially, such as by depositing a layer of metal on a silicon-rich layer, and reacting the layer of metal with the underlying silicon-rich layer. Metals and metal alloys are generally formed by a PVD process, such as sputtering.

The floating gate 204 will generally have the gate dielectric layer 203 on one side and the FE layer 206 on the other side. As such, the floating gate 204 may require multiple layers to provide adhesion to adjoining layers and/or to provide barrier properties for the ferroelectric material. For one embodiment, the floating gate 204 contains a metal layer overlying a conductively-doped polysilicon layer. For a further embodiment, the metal layer contains more than one metal layer, such as a layer of platinum overlying a layer of titanium. For another embodiment, the metal layer contains a layer of iridium overlying a layer of iridium oxide ($IrO_2$).

The FE layer 206 is formed overlying the floating gate 204. For one embodiment, the FE layer 206 is a metal oxide, such as strontium bismuth tantalite (SBT) or lead zirconium titanate (PZT). Other metal oxides having ferroelectric properties may be used for the FE layer 206. Some examples include lanthanum-doped PZT (PLZT), lithium niobate (LiNbO3), or additional metal oxides having a perovskite crystalline structure. The metal oxide may be formed by such CVD techniques as metal organic decomposition. For one embodiment, the floating gate 204 is eliminated for cases where the gate dielectric layer 203 is compatible with the FE layer 206, such that the FE layer 206 is both overlying and adjoining the gate dielectric layer 203. For a further embodiment, the gate dielectric layer 203 and the floating gate 204 are eliminated where the FE layer 206 is compatible with the polysilicon layer 106, such that the FE layer 206 is both overlying and adjoining the polysilicon layer 106.

A control gate 207 is formed overlying the FE layer 206. The control gate 207 contains a conductive material. For one embodiment, the control gate 207 includes a barrier layer, such as a metal barrier layer. For a further embodiment, the control gate 207 contains more than one layer. As one example, the control gate 207 may contain a layer of titanium overlying a layer of platinum. As another example, the control gate 207 may contain a metal layer overlying a conductive metal oxide layer, such as a layer of iridium overlying a layer of iridium oxide.

A cap layer 212 is generally formed overlying the control gate 207 to act as an insulator and barrier layer for the gate stack 208. The cap layer 212 contains an insulating material and may include such insulators as silicon oxide, silicon nitride, and silicon oxynitrides. For one embodiment, the cap layer 212 is silicon nitride, formed by such methods as CVD or PVD.

Figure 3:
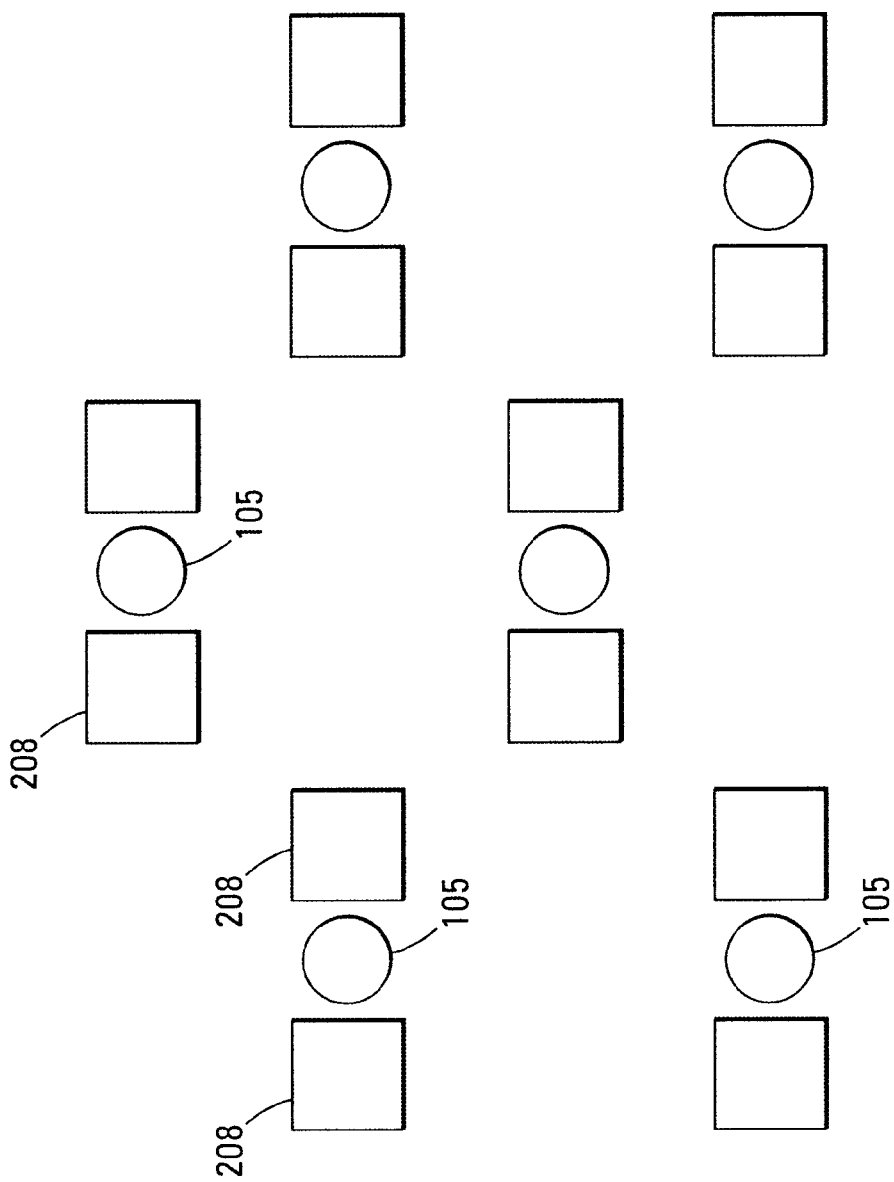
FIG. 3 is a top view of the memory cells of FIG. 1A in accordance with a further embodiment of the invention.

The gate dielectric layer 203, the floating gate 204, the FE layer 206, the control gate 207 and the cap layer 212 are subsequently patterned to define the gate stacks 208 as depicted in FIG. 2A. Patterning can include use of standard photolithographic techniques. As an example, a layer of photoresist may be deposited, exposed with an energy source, and developed to expose portions of the layers making up gate stacks 208. Material is then removed from the exposed portions, including the exposed portions of the gate dielectric layer 203, the floating gate 204, the FE layer 206, the control gate 207 and the cap layer 212. Such removal may typically include chemical or ion etching. The resist is then removed, such as by plasma etch. FIG. 3 shows a top view of the resulting gate stacks 208 following patterning in accordance with one embodiment of the invention.

While the definition of the gate stacks 208 in the foregoing description is performed in a single patterning step, the layers may be individually patterned. For one embodiment, the gate dielectric layer 203 and the floating gate 204 are patterned prior to formation of the FE layer 206. The FE layer 206 is then patterned to have a width less than the width of the previous layers. Such a structure can provide additional diffusion barrier characteristics upon formation of the control gate 207; the control gate 207 can overlie both the surface and sidewalls of the FE layer 206.

Figure 2B:
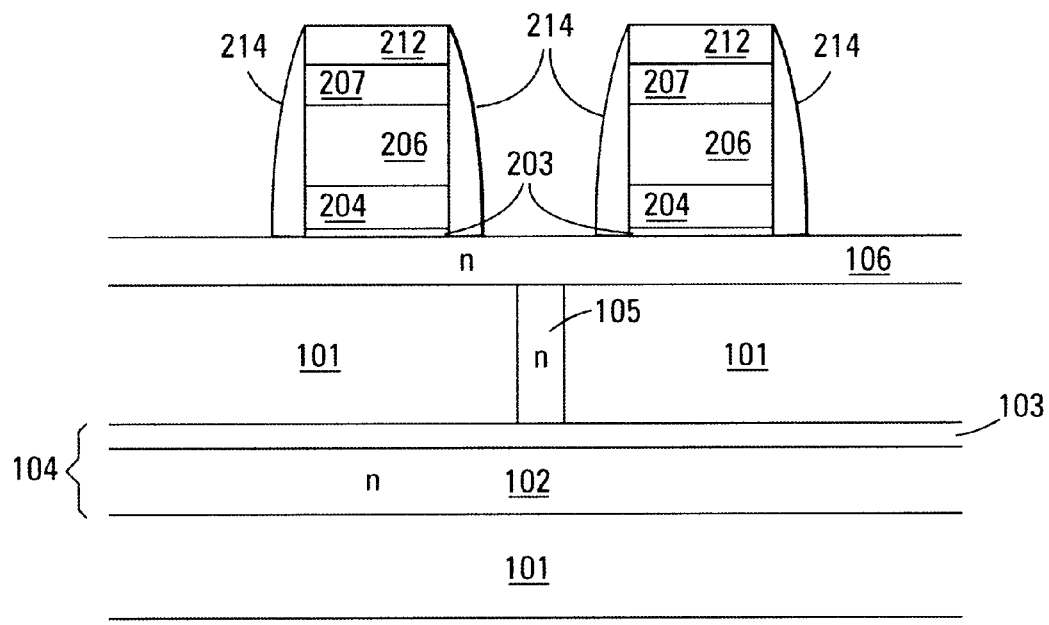

The sidewalls of the gate stacks are then insulated using sidewall spacers 214. The sidewall spacers 214 contain an insulating material arid may include the same materials as the cap layer 212. The sidewall spacers 214 are typically formed by blanket depositing an insulating layer, such as a layer of silicon nitride, over the entire structure and then anisotropically etching the insulating layer to preferentially remove the horizontal regions and leave only the vertical regions adjacent the sidewalls of the gate stacks 208. The resulting transistor is shown in FIG. 2B.

Figure 2C:
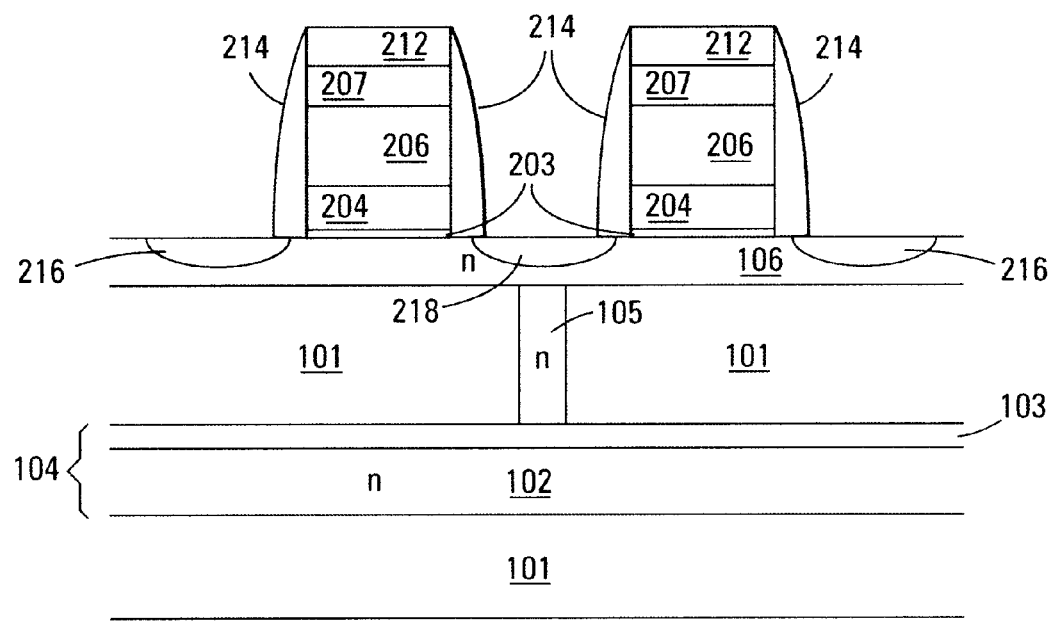
Figure 4:
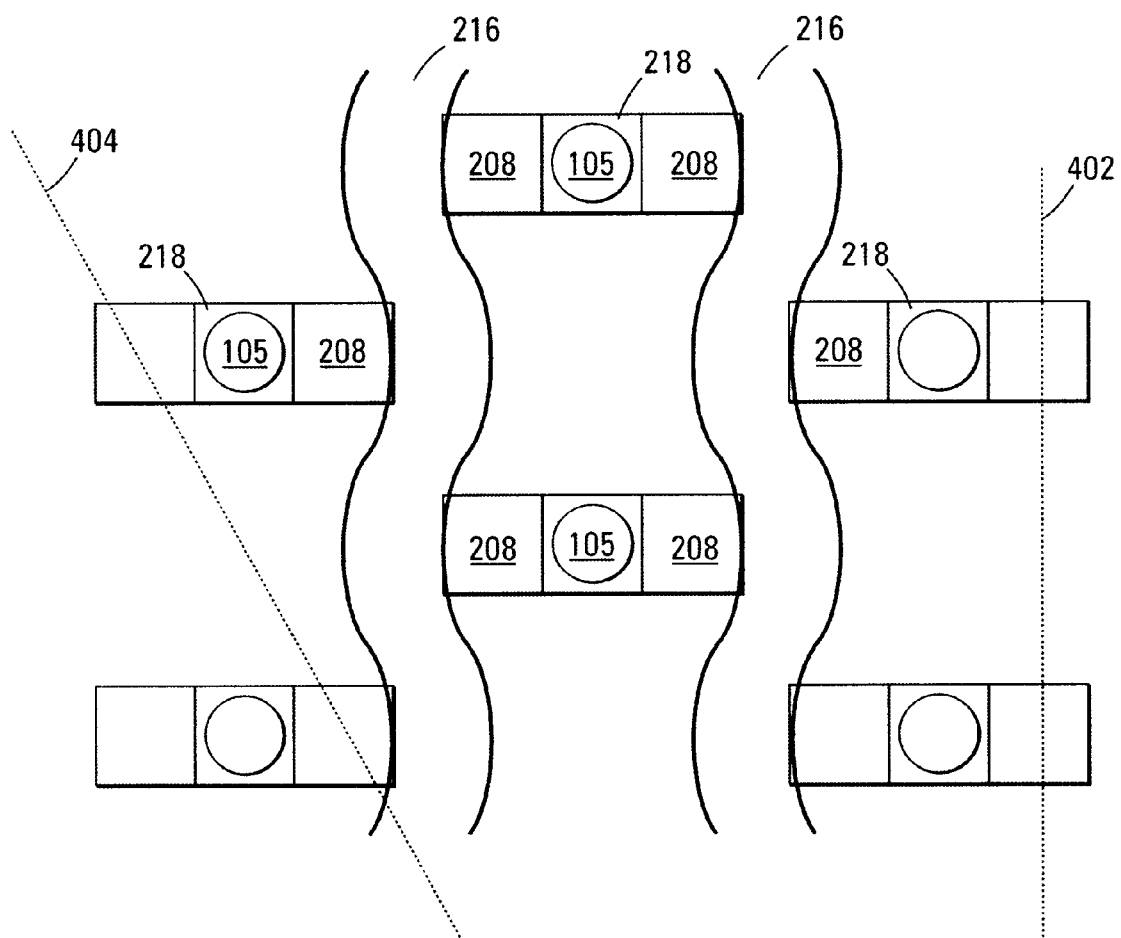
FIG. 4 is a top view of the memory cells of FIG. 1C in accordance with a further embodiment of the invention.

In FIG. 2C, source/drain regions 216 and 218 are formed adjacent the sidewalls of the gate stacks 208. First source/ drain regions 216 are conductive traces forming or coupling to program lines for the ferroelectric transistor. Second source/drain regions 218 are conductive islands for coupling to a bit line 104, such as through the conductive plug 105. For one embodiment, the first source/drain regions 216 and the second source/drain regions 218 contain metal silicide. For a further embodiment, the metal silicide is formed by masking the polysilicon layer 106 to define further source/drain regions, forming a refractory metal layer on exposed portions of the polysilicon layer 216, annealing the substrate (and, thus, the polysilicon layer 106) to form refractory metal silicide in the polysilicon layer 106, and removing unreacted metal. Other processes are available for forming the metal silicide, such as implanting portions of the polysilicon layer 106 with refractory metal ions or atoms, and annealing the polysilicon layer 106. For another embodiment, the conductive traces and islands of the source/drain regions 216 and 218 are doped regions of the layer 106 formed by conductively doping the source/drain regions 216 and 218 to have the same conductivity type as the layer 106, but at a higher dopant level. The doped region of the first source/drain region may form the program line or a program line may be formed overlying and in contact with this doped region. FIG. 4 is a top view of the gate stacks 208 showing the formation of the source/drain regions 216 and 218.

Figure 2D:
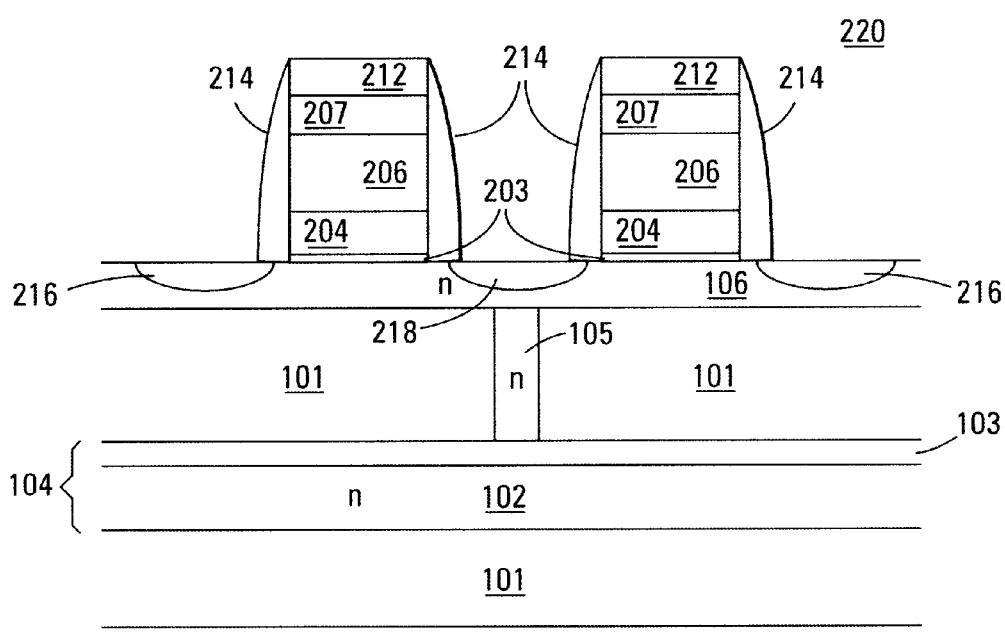

A second bulk insulator layer 220 is formed overlying the gate stacks 208 as shown in FIG. 2D. The second bulk insulator layer 220 can contain the same types of materials described with reference to the first bulk insulator layer 101.

Figure 2E:
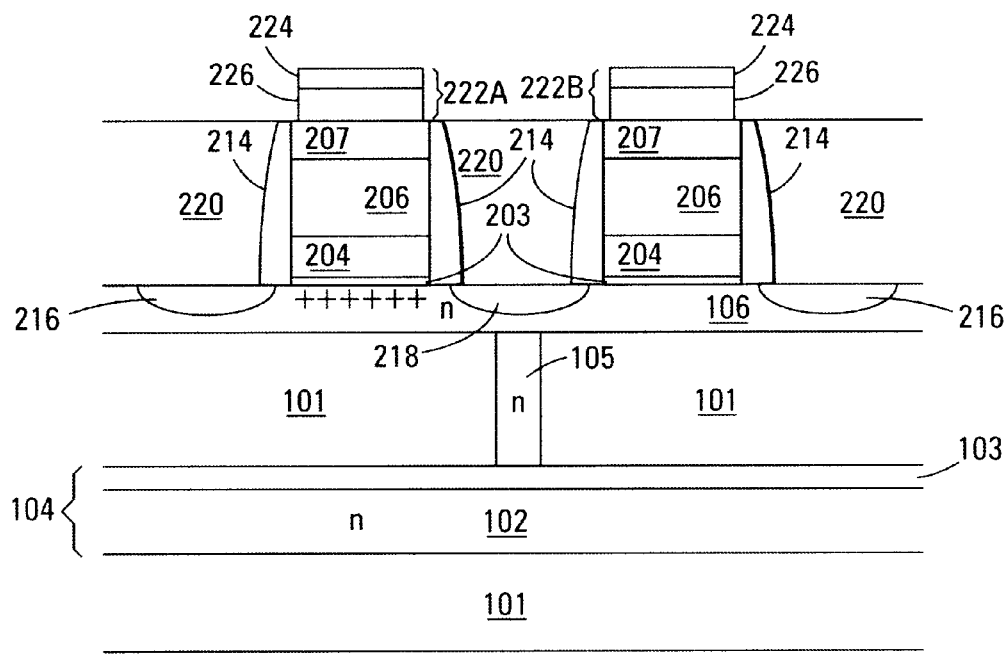

A portion of the bulk insulator layer 220, a portion of the sidewall spacers 214 and the cap layer 212 are removed in FIG. 2E. Removal of the portion of the bulk insulator layer 220, the portion of the sidewall spacers 214 and the cap layer 212 may be performed through planarization techniques, such as chemical-mechanical planarization (CMP). The removal is performed to expose at least a portion of the control gates 207 for coupling to the word lines 222. Alternatively, the bulk insulator layer 220 could be patterned to define contact holes to the control gates 207. Word lines 222 are then formed overlying and coupled to the control gates 207. The word lines 222 contain a conductive material. The word lines 222 may have the same type of construction as the bit lines 104. The word lines 222 are coupled to rows of memory cells of the memory array. With reference to FIG. 4, the word lines 222 may be formed substantially parallel to the first source/drain regions 216 as depicted by dashed line 402. For another embodiment, the word lines 222 may be formed at an angle to the first source/drain regions 216 as depicted by dashed line 404.

Each transistor of each word line 222 can have a first programmed state representing a first data value, such as a data value of 1, or a second programmed state representing a second data value, such as a data value of 0. The programmed state is a function of the polarization state of the FE layer 206. The transistor coupled to word line 222A depicts an FE layer 206 programmed to the second programmed state. In the second programmed state, the additional negative voltage at the gate dielectric layer 203 causes a depletion layer to form underneath the gate, so that the transistor is deactivated at a zero gate/source voltage corresponding to an "off" state. The transistor coupled to word line 222B depicts an FE layer 206 programmed to the first programmed state. In the first programmed state, the additional positive voltage at the gate dielectric layer 203 will attract electrons, such that the transistor is activated at a zero gate/source voltage corresponding to an "on" state.

Figure 5:
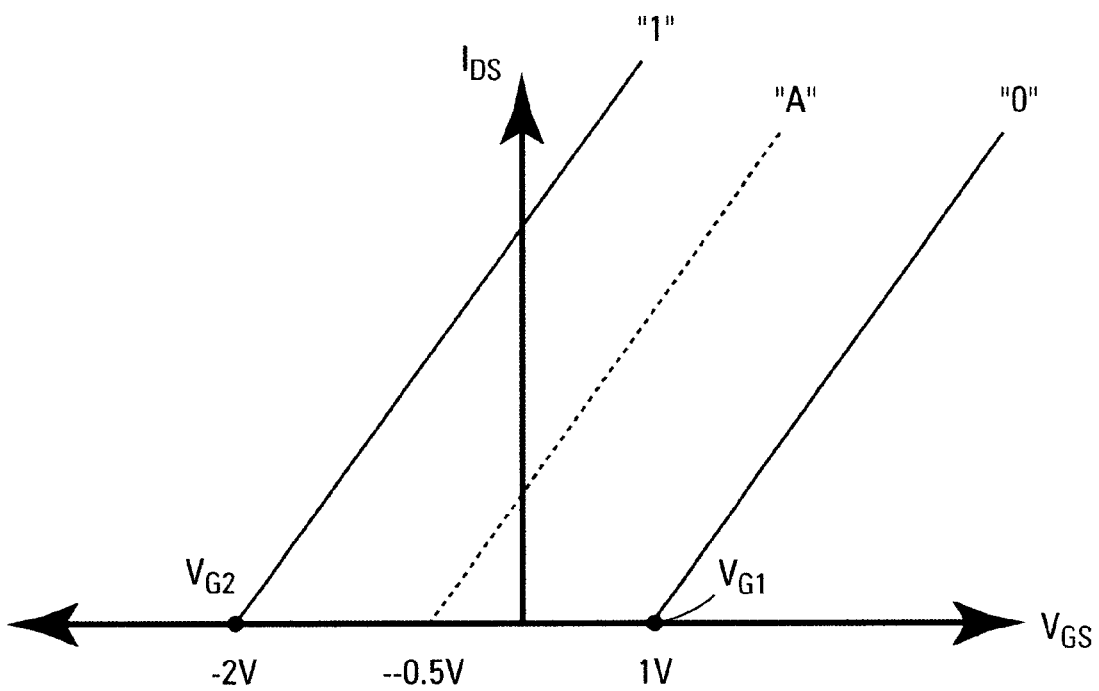
FIG. 5 is a diagram of current/voltage curves ($I_{DS}$ VS. $V_{GS}$) for two different polarization states of a transistor in accordance with the invention in relation to a comparable transistor without a ferroelectric layer.

FIG. 5 shows example current/voltage curves ($I_{DS}$ vs. $V_{GS}$) for the two different polarization states of one embodiment of the transistor. A ferroelectric transistor that is in the first programmed state will turn on at a lower gate/source voltage $V_{GS}$ (in this example, where $V_{GS}=V_{G2}=-2$ V) relative to a comparable depletion-mode transistor without a ferroelectric layer, shown as "A" in FIG. 5. Likewise, a ferroelectric transistor that is in the second programmed state will turn on at a higher $V_{GS}$ (in this example, where $V_{GS}=V_{G1}=1$ V). While specific potential levels were used in the example, FIG. 5 is provided for illustrative purposes to show that varying the polarization of the ferroelectric layer 206 will alter the threshold voltage of the transistor, thus determining whether the transistor will be activated or deactivated in response to a given $V_{GS}$. Accordingly, the invention is not limited to the specific values of $V_{GS}$. The programmed state of the FE layer 206 can be written to by applying a voltage level, positive or negative, across the memory cell transistor sufficient to cause reversal of polarity of its FE layer 206. The programmed state of the FE layer 206 can be read by applying a voltage level sufficient to activate a memory cell transistor having an FE layer 206 programmed to the first programmed state or first polarization state, but insufficient to activate a memory cell transistor having an FE layer 206 programmed to the second programmed state or second polarization state. Conventional sensing architectures and methods can be used to sense the conducting state of the selected cells.

Figure 6:
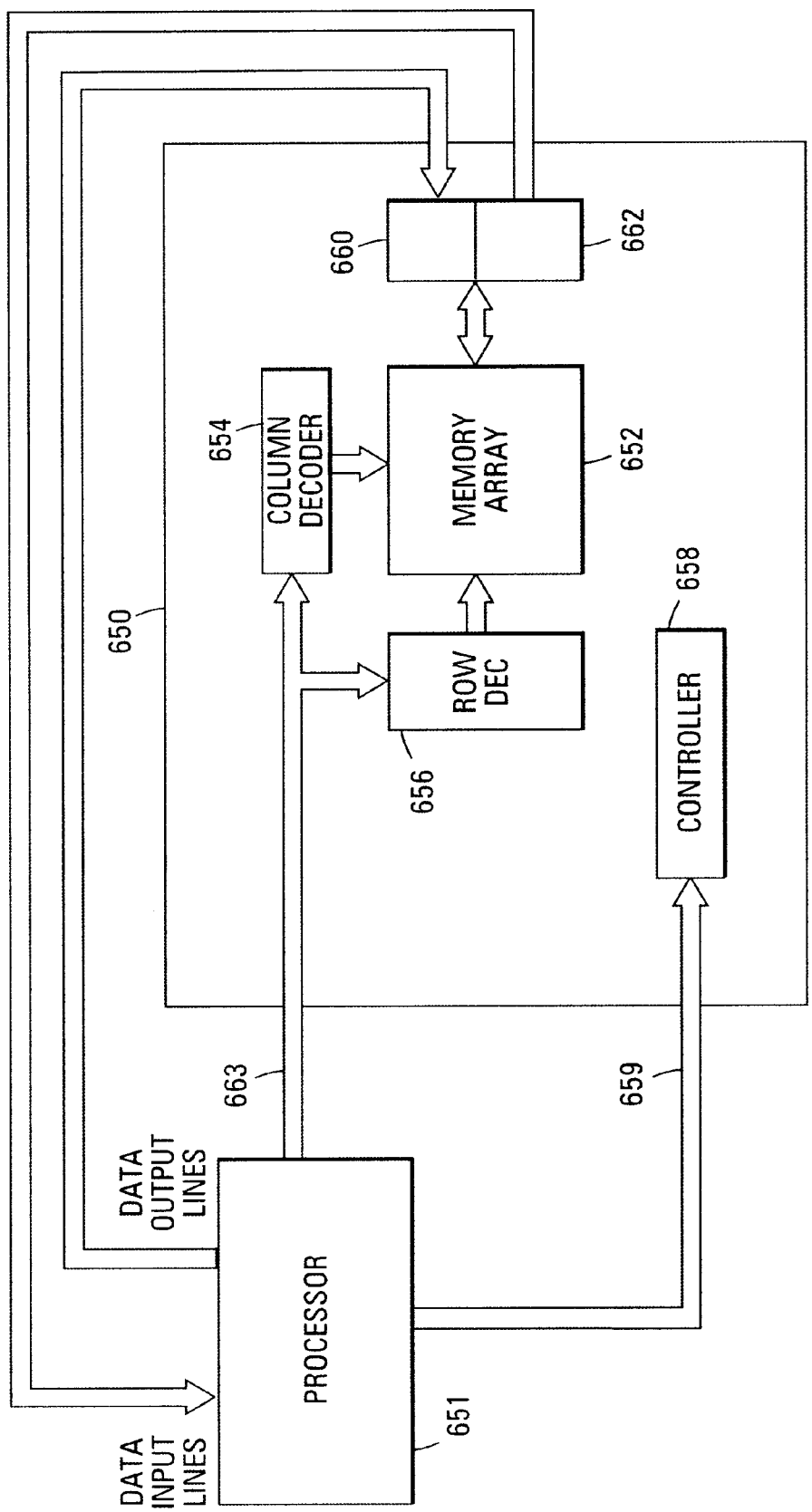
FIG. 6 is a block diagram of a memory device in accordance with an embodiment of the invention.

FIG. 6 shows a general block diagram of a memory device 650 incorporating ferroelectric floating-gate memory cells and array architectures in accordance with the various embodiments of the invention. The ferroelectric memory device 650 is coupled to a processor 651 to form an electronic system. The memory device includes a memory array 652, column decoder 654 and row decoder 656, and a control circuit 658. The memory array 652 contains memory cells arranged in rows and columns. The memory array 652 contains the ferroelectric floating-gate memory cells and/or array architectures in accordance with the various embodiments of the invention.

The memory device 650 further includes input 660 and output 662 buffers connected to data input and data output lines, respectively. The data input and output lines can be multiplexed together, but have been illustrated separately for simplicity. Address lines 663 are provided as input to the column decoder 654 and row decoder 656 to address a portion of the memory array 652.

In operation, the memory device control circuit 658 responds to control inputs 659 from the processor 651 to control operations performed on the memory array 652. In particular, the control circuit 658 is used to read data from and write data to the memory array 652. During one of these access operations, an address provided on the address lines 663 is decoded by the row decoder 656 to activate a word line, thereby accessing a row of the memory array 652. Likewise, an address provided on the address lines 663 is decoded by the column decoder 654 to activate at least one bit line, thereby accessing at least one column of the memory array 652. An addressed memory cell is located at the intersection between each activated word line and each activated bit line. During a read operation, the data stored in the addressed memory cell(s) is then transferred to the output buffer 662 and provided on the data output lines. In a write operation, the addressed memory cell is accessed and data provided on the data input lines is stored in the cell.

CONCLUSION

Depletion-mode ferroelectric transistors are described herein for use as non-volatile memory cells. Such memory cells find use in non-volatile memory devices as well as other electronic systems having non-volatile memory storage. Various embodiments are described having ferroelectric transistors formed on a semiconductor layer overlying a bit line. By forming the transistors on this elevated semiconductor layer, the underlying substrate is usable for other components of a memory device, such as sensing devices and decoder circuits, thus facilitating higher-density devices. Because the transistors display bulk transport characteristics, they can be fabricated on polysilicon as the semiconductor layer despite relatively poor Si—SiO$_2$ interfaces.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A ferroelectric memory cell, comprising:
   a ferroelectric layer formed overlying a conductively-doped semiconductor layer, wherein the semiconductor layer is formed overlying a bit line;
   a control gate formed overlying the ferroelectric layer and coupled to a word line;
   a first source/drain region formed in the semiconductor layer, wherein the first source/drain region is coupled to a program line; and
   a second source/drain region formed in the semiconductor layer, wherein the second source/drain region is coupled to the bit line.

2. The ferroelectric memory cell of claim 1, wherein a gate dielectric layer is interposed between the ferroelectric layer and the semiconductor layer.

3. The ferroelectric memory cell of claim 2, wherein the gate dielectric layer is formed overlying and adjoining the semiconductor layer, a floating gate is formed overlying and adjoining the gate dielectric layer, and the ferroelectric layer is formed overlying and adjoining the floating gate.

4. The ferroelectric memory cell of claim 1, wherein the semiconductor layer further comprises a silicon-containing layer selected from the group consisting of a polysilicon layer and a monocrystalline silicon layer.

5. The ferroelectric memory cell of claim 1, wherein the semiconductor layer further comprises a silicon-containing layer and wherein the first and second source/drain regions contain a metal silicide formed in the silicon-containing layer.

6. The ferroelectric memory cell of claim 1, wherein the first and second source/drain regions are doped regions of the semiconductor layer having a conductivity type the same as a conductivity type of the semiconductor layer and a dopant level higher than a dopant level of the semiconductor layer.

7. A ferroelectric memory cell, comprising:
   a ferroelectric layer formed overlying a conductively-doped silicon-containing semiconductor layer, wherein the semiconductor layer is formed overlying a bit line;
   a control gate formed overlying the ferroelectric layer and coupled to a word line;
   a first source/drain region formed in the semiconductor layer and containing a metal silicide, wherein the first source/drain region is coupled to a program line; and
   a second source/drain region formed in the semiconductor layer and containing a metal silicide, wherein the second source/drain region is coupled to the bit line.

8. The ferroelectric memory cell of claim 7, wherein a gate dielectric layer is interposed between the ferroelectric layer and the semiconductor layer.

9. The ferroelectric memory cell of claim 8, wherein the gate dielectric layer is formed overlying and adjoining the semiconductor layer, a floating gate is formed overlying and adjoining the gate dielectric layer, and the ferroelectric layer is formed overlying and adjoining the floating gate.

10. The ferroelectric memory cell of claim 7, wherein the semiconductor layer further comprises a conductively-doped polysilicon layer.

11. The ferroelectric memory cell of claim 7, wherein the metal silicide of both the first source/drain region and the second source/drain region is formed by depositing a metal layer on the semiconductor layer, annealing the semiconductor layer to form the metal silicide, and removing unreacted metal.

12. A ferroelectric memory array, comprising:
   a plurality of program lines formed in a conductively-doped semiconductor layer;
   a plurality of bit lines formed below the semiconductor layer;
   a plurality of ferroelectric transistors formed on the conductively-doped semiconductor layer, each ferroelectric transistor having a first source/drain region coupled to a program line, a second source/drain region coupled to a bit line, and a control gate; and
   a plurality of word lines formed on the plurality of ferroelectric transistors, each ferroelectric transistor having its control gate coupled to a word line.

13. The ferroelectric memory array of claim 12, wherein the conductively-doped semiconductor layer is an n-type polysilicon layer.

14. The ferroelectric memory array of claim 13, wherein the n-type polysilicon layer is formed overlying a bulk insulator layer.

15. The ferroelectric memory array of claim 12, wherein the semiconductor layer further comprises a silicon-containing layer and wherein each first and second source/drain region contains a metal silicide formed in the silicon-containing layer.

16. The ferroelectric memory array of claim 12, wherein each first source/drain region and each second source/drain region are doped regions of the semiconductor layer having a conductivity type the same as a conductivity type of the semiconductor layer and a dopant level higher than a dopant level of the semiconductor layer.

17. A memory cell, comprising:
   a gate dielectric layer formed on a conductively-doped polysilicon layer, wherein the conductively-doped polysilicon layer is formed overlying a bulk insulator layer;
   a floating gate formed on the gate dielectric layer;
   a ferroelectric layer formed on the floating gate;
   a control gate formed on the ferroelectric layer and coupled to a word line;
   a metal silicide trace formed in the polysilicon layer as a first source/drain region; and
   a metal silicide island formed in the polysilicon layer as a second source/drain region.

18. A memory device, comprising:
   an array of memory cells, wherein each memory cell comprises:

a ferroelectric layer formed overlying a conductively-doped semiconductor layer, wherein the semiconductor layer is formed overlying a bit line;

a control gate formed overlying the ferroelectric layer;

a first source/drain region formed in the semiconductor layer; and a second source/drain region formed in the semiconductor layer;

a plurality of word lines coupled to rows of memory cells of the array of memory cells through their control gates;

a plurality of program lines coupled to columns of memory cells of the array of memory cells through their first source/drain regions;

a plurality of bit lines coupled to columns of memory cells of the array of memory cells through their second source/drain regions;

a row decoder coupled to the array of memory cells; and a column decoder coupled to the array of memory cells.

19. The memory device of claim 18, wherein the semiconductor layer further comprises a conductively-doped polysilicon layer.

20. The memory device of claim 18, wherein the semiconductor layer further comprises a silicon-containing layer and wherein the first and second source/drain regions contain a metal silicide formed in the silicon-containing layer.

21. The memory device of claim 18, wherein the first and second source/drain regions are doped regions of the semiconductor layer having a conductivity type the same as a conductivity type of the semiconductor layer and a dopant level higher than a dopant level of the semiconductor layer.

22. A memory device, comprising:

an array of memory cells, wherein each memory cell comprises:

a gate dielectric layer formed on a conductively-doped polysilicon layer, wherein the conductively-doped polysilicon layer is formed overlying a bulk insulator layer;

a floating gate formed on the gate dielectric layer;

a ferroelectric layer formed on the floating gate;

a control gate formed on the ferroelectric layer;

a metal silicide trace formed in the polysilicon layer as a first source/drain region; and a metal silicide island formed in the polysilicon layer as a second source/drain region;

a plurality of word lines coupled to rows of memory cells of the array of memory cells through their control gates;

a plurality of program lines coupled to columns of memory cells of the array of memory cells through their first source/drain regions;

a plurality of bit lines coupled to columns of memory cells of the array of memory cells through their second source/drain regions;

a row decoder coupled to the array of memory cells; and a column decoder coupled to the array of memory cells.

23. A memory device, comprising:

an array of memory cells arranged in rows and columns;

a plurality of program lines formed in a conductively-doped semiconductor layer;

a plurality of bit lines formed below the semiconductor layer;

a plurality of ferroelectric transistors formed on the conductively-doped semiconductor layer, each ferroelectric transistor having a first source/drain region coupled to a program line, a second source/drain region coupled to a bit line, and a control gate; and a plurality of word lines formed on the plurality of ferroelectric transistors, each ferroelectric transistor having its control gate coupled to a word line;

a row decoder coupled to the array of memory cells; and a column decoder coupled to the array of memory cells.

24. An electronic system, comprising:

a processor; and a memory device coupled to the processor, wherein the memory device comprises:

an array of memory cells, wherein each memory cell comprises:

a ferroelectric layer formed overlying a conductively-doped semiconductor layer, wherein the semiconductor layer is formed overlying a bit line;

a control gate formed overlying the ferroelectric layer;

a first source/drain region formed in the semiconductor layer; and a second source/drain region formed in the semiconductor layer;

a plurality of word lines coupled to rows of memory cells of the array of memory cells through their control gates;

a plurality of program lines coupled to columns of memory cells of the array of memory cells through their first source/drain regions;

a plurality of bit lines coupled to columns of memory cells of the array of memory cells through their second source/drain regions;

a row decoder coupled to the array of memory cells; and a column decoder coupled to the array of memory cells.

25. The electronic system of claim 24, wherein the semiconductor layer further comprises a conductively-doped polysilicon layer.

26. The electronic system of claim 24, wherein the semiconductor layer further comprises a silicon-containing layer and wherein the first and second source/drain regions contain a metal silicide formed in the silicon-containing layer.

27. The electronic system of claim 24, wherein the first and second source/drain regions are doped regions of the semiconductor layer having a conductivity type the same as a conductivity type of the semiconductor layer and a dopant level higher than a dopant level of the semiconductor layer.

28. An electronic system, comprising:

a processor; and a memory device coupled to the processor, wherein the memory device comprises:

an array of memory cells, wherein each memory cell comprises:

a gate dielectric layer formed on a conductively-doped polysilicon layer, wherein the conductively-doped polysilicon layer is formed overlying a bulk insulator layer;

a floating gate formed on the gate dielectric layer;

a ferroelectric layer formed on the floating gate;

a control gate formed on the ferroelectric layer;

a metal silicide trace formed in the polysilicon layer as a first source/drain region; and a metal silicide island formed in the polysilicon layer as a second source/drain region;

a plurality of word lines coupled to rows of memory cells of the array of memory cells through their control gates;
a plurality of program lines coupled to columns of memory cells of the array of memory cells through their first source/drain regions;
a plurality of bit lines coupled to columns of memory cells of the array of memory cells through their second source/drain regions;
a row decoder coupled to the array of memory cells; and
a column decoder coupled to the array of memory cells.

29. An electronic system, comprising:
a processor; and
a memory device coupled to the processor, wherein the memory device comprises:
an array of memory cells arranged in rows and columns;
a plurality of program lines formed in a conductively-doped semiconductor layer;
a plurality of bit lines formed below the semiconductor layer;
a plurality of ferroelectric transistors formed on the conductively-doped semiconductor layer, each ferroelectric transistor having a first source/drain region coupled to a program line, a second source/drain region coupled to a bit line, and a control gate; and
a plurality of word lines formed on the plurality of ferroelectric transistors, each ferroelectric transistor having its control gate coupled to a word line;
a row decoder coupled to the array of memory cells; and
a column decoder coupled to the array of memory cells.

30. A method of writing to a ferroelectric memory cell, comprising:
applying a voltage level across a ferroelectric transistor of the memory cell sufficient to cause reversal of polarity of a ferroelectric layer of the ferroelectric transistor, wherein the ferroelectric transistor comprises:
the ferroelectric layer formed overlying a conductively-doped semiconductor layer, wherein the semiconductor layer is formed overlying a bulk insulator layer;
a control gate formed overlying the ferroelectric layer;
a first source/drain region formed in the semiconductor layer as a conductive trace; and
a second source/drain region formed in the semiconductor layer as a conductive island.

31. A method of writing to a ferroelectric memory cell, comprising:
applying a voltage level across a ferroelectric transistor of the memory cell sufficient to cause reversal of polarity of a ferroelectric layer of the ferroelectric transistor, wherein the ferroelectric transistor comprises:
the ferroelectric layer formed overlying a conductively-doped silicon-containing semiconductor layer, wherein the semiconductor layer is formed overlying a bulk insulator layer;
a control gate formed overlying the ferroelectric layer;
a first source/drain region formed in the semiconductor layer and containing a metal silicide; and
a second source/drain region formed in the semiconductor layer and containing a metal silicide.

32. A method of writing to a ferroelectric memory cell, comprising:
applying a voltage level across a ferroelectric transistor of the memory cell sufficient to cause reversal of polarity of a ferroelectric layer of the ferroelectric transistor, wherein the ferroelectric transistor comprises:
a gate dielectric layer formed on a conductively-doped polysilicon layer, wherein the conductively-doped polysilicon layer is formed overlying a bulk insulator layer;
a floating gate formed on the gate dielectric layer;
the ferroelectric layer formed on the floating gate;
a control gate formed on the ferroelectric layer;
a conductive trace formed in the polysilicon layer as a first source/drain region; and
a conductive island formed in the polysilicon layer as a second source/drain region.

33. A method of writing to a ferroelectric memory cell, comprising:
applying a voltage level across a ferroelectric transistor of the memory cell sufficient to cause reversal of polarity of a ferroelectric layer of the ferroelectric transistor, wherein the ferroelectric transistor comprises:
a gate dielectric layer formed on a conductively-doped polysilicon layer, wherein the conductively-doped polysilicon layer is formed overlying a bulk insulator layer;
a floating gate formed on the gate dielectric layer;
the ferroelectric layer formed on the floating gate;
a control gate formed on the ferroelectric layer;
a metal silicide trace formed in the polysilicon layer as a first source/drain region; and
a metal silicide island formed in the polysilicon layer as a second source/drain region.

34. A method of reading a ferroelectric memory cell, comprising:
applying voltage level sufficient to activate a ferroelectric transistor of the memory cell having a ferroelectric layer programmed to a first polarization state and insufficient to activate the ferroelectric transistor having the ferroelectric layer programmed to a second polarization state, wherein the ferroelectric transistor comprises:
the ferroelectric layer formed overlying a conductively-doped semiconductor layer, wherein the semiconductor layer is formed overlying a bulk insulator layer;
a control gate formed overlying the ferroelectric layer;
a first source/drain region formed in the semiconductor layer as a conductive trace; and
a second source/drain region formed in the semiconductor layer as a conductive island; and
sensing a conducting state of the ferroelectric transistor in response to the applied voltage level.

35. A method of reading a ferroelectric memory cell, comprising:
applying voltage level sufficient to activate a ferroelectric transistor of the memory cell having a ferroelectric layer programmed to a first polarization state and insufficient to activate the ferroelectric transistor having the ferroelectric layer programmed to a second polarization state, wherein the ferroelectric transistor comprises:
the ferroelectric layer formed overlying a conductively-doped silicon-containing semiconductor layer, wherein the semiconductor layer is formed overlying a bulk insulator layer;
a control gate formed overlying the ferroelectric layer;
a first source/drain region formed in the semiconductor layer and containing a metal silicide; and
a second source/drain region formed in the semiconductor layer and containing a metal silicide; and sensing a conducting state of the ferroelectric transistor in response to the applied voltage level.

36. A method of reading a ferroelectric memory cell, comprising:

applying voltage level sufficient to activate a ferroelectric transistor of the memory cell having a ferroelectric layer programmed to a first polarization state and insufficient to activate the ferroelectric transistor having the ferroelectric layer programmed to a second polarization state, wherein the ferroelectric transistor comprises:
  a gate dielectric layer formed on a conductively-doped polysilicon layer, wherein the conductively-doped polysilicon layer is formed overlying a bulk insulator layer;
  a floating gate formed on the gate dielectric layer;
  the ferroelectric layer formed on the floating gate;
  a control gate formed on the ferroelectric layer;
  a conductive trace formed in the polysilicon layer as a first source/drain region; and
  a conductive island formed in the polysilicon layer as a second source/drain region; and
sensing a conducting state of the ferroelectric transistor in response to the applied voltage level.

37. A method of reading a ferroelectric memory cell, comprising:

applying voltage level sufficient to activate a ferroelectric transistor of the memory cell having a ferroelectric layer programmed to a first polarization state and insufficient to activate the ferroelectric transistor having the ferroelectric layer programmed to a second polarization state, wherein the ferroelectric transistor comprises:
  a gate dielectric layer formed on a conductively-doped polysilicon layer, wherein the conductively-doped polysilicon layer is formed overlying a bulk insulator layer;
  a floating gate formed on the gate dielectric layer;
  the ferroelectric layer formed on the floating gate;
  a control gate formed on the ferroelectric layer;
  a metal silicide trace formed in the polysilicon layer as a first source/drain region; and
  a metal silicide island formed in the polysilicon layer as a second source/drain region; and
sensing a conducting state of the ferroelectric transistor in response to the applied voltage level.

* * * * *

UNITED STATES PATENT AND TRADEMARK OFFICE
CERTIFICATE OF CORRECTION

PATENT NO.    : 6,574,131 B1
DATED         : June 3, 2003
INVENTOR(S)   : Craig T. Salling It is certified that error appears in the above-identified patent and that said Letters Patent is hereby corrected as shown below:

Title page,
Item [*] Notice, should read -- Subject to any disclaimer, the term of this patent is extended or adjusted under 35 U.S.C. 154(b) by 371 days. --

Signed and Sealed this

Third Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,574,131 B1
DATED          : June 3, 2003
INVENTOR(S)    : Craig T. Salling It is certified that error appears in the above-identified patent and that said Letters Patent is hereby corrected as shown below:

<u>Title page,</u>
Item [*] Notice, delete the phrase "by 315 days" and insert -- by 371 days --

Signed and Sealed this

Twenty-eighth Day of September, 2004

JON W. DUDAS
*Director of the United States Patent and Trademark Office*